United States Patent
Aoi (10) Patent No.: US 7,691,453 B2
(45) Date of Patent: Apr. 6, 2010

(54) METHOD FOR FORMING ORGANIC/INORGANIC HYBRID INSULATION FILM

(75) Inventor: Nobuo Aoi, Hyogo (JP)

(73) Assignee: Panasonic Corporation, Osaka (JP)

( * ) Notice: Subject to any disclaimer, the term of this patent is extended or adjusted under 35 U.S.C. 154(b) by 1156 days.

(21) Appl. No.: 11/023,418

(22) Filed: Dec. 29, 2004

(65) Prior Publication Data

US 2005/0181594 A1    Aug. 18, 2005

(30) Foreign Application Priority Data

Feb. 13, 2004    (JP) .............................. 2004-037050

(51) Int. Cl.
*H05H 4/24*    (2006.01)
(52) U.S. Cl. ..................................... 427/569
(58) Field of Classification Search .................. 427/596
See application file for complete search history.

(56) References Cited

U.S. PATENT DOCUMENTS

| | | | | |
|---|---|---|---|---|
| 4,492,733 | A * | 1/1985 | Phillips et al. | 428/412 |
| 6,086,952 | A | 7/2000 | Lang et al. | |
| 6,362,115 | B1 * | 3/2002 | Mandal | 438/780 |
| 7,087,271 | B2 | 8/2006 | Rhee et al. | |

FOREIGN PATENT DOCUMENTS

| | | |
|---|---|---|
| DE | 41 26 759 A1 | 2/1993 |
| EP | 0 516 308 A1 | 12/1992 |
| EP | 0 528 540 A2 | 2/1993 |
| EP | 0 935 283 A2 | 8/1999 |
| EP | 1 050 599 A2 | 11/2000 |
| JP | 57-172741 A | 10/1982 |
| JP | 2000-012532 A | 1/2000 |
| JP | 2001-35843 A | 2/2001 |
| JP | 3190886 | 5/2001 |
| JP | 2002-518837 A | 6/2002 |
| JP | 2003-332328 A | 11/2003 |
| JP | 2004-47873 A | 2/2004 |
| JP | 2004-534400 A | 11/2004 |
| JP | 2005-51192 A | 2/2005 |
| WO | WO 01/29052 A1 | 4/2001 |
| WO | WO 03/019645 A1 | 3/2003 |
| WO | WO 03/095702 A2 | 11/2003 |

OTHER PUBLICATIONS

Silicon-Containing Polymers—The Science and Technology of Their Synthesis and Applications (2000). Jones Richard. pp. 8, 17, 102, 104, 102, 150, 735.*
Elmhurst College website: [one page] (2003).*
Japanese Office Action issued in corresponding Japanese Patent Application No. JP 2004-367596, dated Dec. 19, 2006.

* cited by examiner

*Primary Examiner*—Timothy Meeks
*Assistant Examiner*—Kelly M Gambetta
(74) *Attorney, Agent, or Firm*—McDermott Will & Emery LLP (57) ABSTRACT

A method for forming an organic/inorganic hybrid insulation film includes the following steps. An organic silicon compound containing siloxane bonds is vaporized, the vaporized organic silicon compound is transported to a reaction chamber maintaining the compound in a monomer state, and then, the organic/inorganic hybrid insulation film having a main chain structure where siloxane parts and organic molecule parts are alternately combined on a substrate installed in the reaction chamber is formed by plasma-polymerizing the vaporized organic silicon compound in the reaction chamber.

12 Claims, 4 Drawing Sheets

METHOD FOR FORMING ORGANIC/INORGANIC HYBRID INSULATION FILM

CROSS-REFERENCE TO RELATED APPLICATIONS

This application claims priority under 35 U.S.C. §119 on Patent Application No. 2004-037050 filed in Japan on Feb. 13, 2004, the entire contents of which are hereby incorporated by reference.

BACKGROUND OF THE INVENTION

The present invention relates to a method for forming an inter-layer insulation film. More specifically, the present invention relates to a method for forming an organic/inorganic hybrid insulation film having a function of preventing Cu ions from diffusing by means of a plasma CVD method.

In recent years, a Cu wiring technology using Cu as a wiring material has been introduced in order to deal with VLSI (Very large Scale Integration) operated at an increasingly higher speed. However, the technology includes a problem that Cu ions are diffused in an inter-layer insulation film due to an electric field or heat, which causes a breakdown voltage of the inter-layer insulation film to deteriorate in a long-term use. When the breakdown voltage of the inter-layer insulation film is thus deteriorated, an insulation failure thereby generated leads to an operation failure of the VLSI.

Therefore, the VLSI including the Cu wiring has so far employed a Cu diffusion preventing film for preventing the diffusion of the Cu ions. A problem in using such a film is that any of SiN, SiON, SiC or SiCO, which are known as a material of an insulation film designed to be used as the Cu diffusion preventing film, has a high dielectric constant of $\geq 4$. Therefore, when a film having a low dielectric constant of approximately 2 to 3 is used as the inter-layer insulation film as a solution, the dielectric constant of the conventional Cu diffusion preventing film having such a high dielectric constant exerts a dominant contribution in a multi-layer wiring structure. To be more specific, when the dielectric constant of the inter-layer insulation film is reduced, an effect resulting from the reduced dielectric constant is counterbalanced by the conventional Cu diffusion preventing film having a high dielectric constant. Therefore, an effective dielectric constant in the entire multi-layer wiring is not reduced to a satisfactory level.

In the presence of the problem, it is presently demanded that the dielectric constant of the Cu diffusion preventing film be reduced or a Cu diffusion preventing function be provided to the inter-layer insulation film having a low dielectric constant.

As a conventional technology for reducing the dielectric constant of the Cu diffusion preventing film, a method for forming a SiCN film by means of a plasma CVD (Chemical Vapor Deposition) using trimethylvinylsilane is reported. The dielectric constant achieved by the method is, however, approximately 4, which is not low enough. There is another report of a method for forming the low-dielectric-constant film having the Cu diffusion preventing function by means of the plasma CVD employing divinylsiloxane bisbenzocyclobutene (as an example of which, see Japanese Unexamined Patent Publication No. 2000-12532). Referring to the report, it is shown that a film having the dielectric constant of approximately 2.7 is formed.

SUMMARY OF THE INVENTION

However, divinylsiloxane bisbenzocyclobutene, which is the material used in the report, has a complicated chemical structure and is therefore costly.

Further, there is a problem that divinylsiloxane bisbenzocyclobutene is likely to be polymerized when heated at 150° C. or more. In order to perform the deposition by means of the plasma CVD method, it is necessary to heat the material to thereby vaporize it. The vaporization requires a temperature equal to or exceeding 150° C. Because of the fact, the technology in the report included a problem that the material was polymerized in a vaporizing device and a piping was accordingly clogged with solid and liquid substances thereby generated, resulting in a reduced operation rate of a CVD apparatus.

There was also a problem in the technology that a heat stability is low because the thermally polymerizable material is used.

Further, divinylsiloxane bisbenzocyclobutene is a bifunctional monomer, and the polymerized film formed from such a monomer by means of the plasma CVD method is, therefore, basically formed from a straight-chain polymer. This generated another problem that it was difficult to integrate such a film into the multi-layer wiring due to its insufficient mechanical strength.

The present invention, in order to solve the foregoing problems, has its main object to provide a method for inexpensively forming an organic/inorganic hybrid insulation film having a higher Cu diffusion preventing function and a lower dielectric constant by means of a process inviting no reduction of an operation rate of a production apparatus, and further, to provide a method for forming an organic/inorganic hybrid insulation film having a thermal stability and high mechanical strength.

In order to solve the problems described above, a first method for forming the organic/inorganic hybrid insulation film according to the present invention comprises a step for vaporizing an organic silicon compound containing siloxane bonds, a step for transporting the vaporized organic silicon compound to a reaction chamber maintaining the compound in a monomer state, and a step for forming the organic/inorganic hybrid insulation film having a main chain structure where siloxane parts and organic molecule parts are alternately combined on a substrate installed in the reaction chamber by plasma-polymerizing the vaporized organic silicon compound in the reaction chamber.

Here, the siloxane bond is a bond represented by Si—O—Si.

According to the first method for forming the organic/inorganic hybrid insulation film, the organic/inorganic hybrid insulation film capable of exerting an effect of preventing the Cu ions from diffusing and having a low dielectric constant can be formed. To describe the formation of the film, the organic silicon compound as the monomer is subjected to the plasma polymerization in respective organic molecular parts thereof and a polymer having the main chain structure, where the siloxane parts and organic parts are alternately combined, is accordingly polymerized to thereby form the organic/inorganic hybrid insulation film on the substrate from the polymer.

The organic silicon compound containing the siloxane bonds used as the material of the organic/inorganic hybrid insulation film is transported to the reaction chamber remaining in the monomer state and plasma-polymerized in the reaction chamber. Because of the process, neither solid nor liquid substance is generated in the vaporizing device or piping, which therefore eliminates a possibility of such a problem as the clogged piping. As a result, the operation rate of the plasma CVD apparatus can be prevented from decreasing.

The effect of preventing the Cu ions from diffusing is obtained by a significantly large potential energy required for the Cu ion to move from a neighborhood of an oxygen atom to a neighborhood of a carbon atom in the siloxane part when the Cu ion moves along the main chain of the polymer.

Further, the organic/inorganic hybrid insulation film has a smaller polarizability of the molecules constituting the film compared to $SiO_2$, therefore has a lower dielectric constant compared to the conventional inter-layer insulation film containing $SiO_2$ as its main component.

As a further advantage, the formed organic/inorganic hybrid insulation film has a higher thermal stability because it is difficult for the organic silicon compound containing the siloxane bonds to be thermally polymerized.

The material recited in the above-mentioned report, which is divinylsiloxane bisbenzocyclobutene, has a complicated structure and is therefore costly, while the organic silicon compound containing the siloxane bonds used as the material of the organic/inorganic hybrid insulation film according to the present invention is available at a lower cost. Therefore, the organic/inorganic hybrid insulation film according to the present invention can be formed at a cost lower than in the conventional technology.

A second method for forming the organic/inorganic hybrid insulation film according to the present invention comprises a step for vaporizing the organic silicon compound containing the siloxane bonds preventing the compound from being thermally polymerized, a step for transporting the vaporized organic silicon compound to the reaction chamber, and a step for forming the organic/inorganic hybrid insulation film having the main chain structure where the siloxane parts and the organic molecule parts are alternately combined on the substrate installed in the reaction chamber by plasma-polymerizing the vaporized organic silicon compound in the reaction chamber.

According to the second method for forming the organic/inorganic hybrid insulation film, the organic/inorganic hybrid insulation film exerting the same effect as in the organic/inorganic hybrid insulation film obtained in the first method for forming the organic/inorganic hybrid insulation film can be formed.

Further, the organic silicon compound containing the siloxane bonds, which is used as the material of the organic/inorganic hybrid insulation film, is vaporized under the condition inviting no thermal polymerization and transported to the reaction chamber to be plasma-polymerized therein. Therefore, neither solid nor liquid substance is generated in the vaporizing device or piping, thereby preventing the piping from clogging or the like. As a result, the reduction of the operation rate of the plasma CVD can be prevented.

In the step for forming the insulation film through the plasma polymerization included in the method for forming the organic/inorganic hybrid insulation film according to the present invention, it is preferable to perform the plasma polymerization without any oxidizing agent.

To perform the plasma polymerization in the foregoing manner can inhibit the combination of the siloxane parts, which occurs more often in the plasma polymerization using the oxidizing agent. The combinations of the organic molecule parts can be thereby dominant, as a result of which the main chain structure, where the siloxane parts and the organic parts are alternately combined, can be easily formed.

In the step for forming the insulation film through the plasma polymerization included in the method for forming the organic/inorganic hybrid insulation film according to the present invention, it is preferable to perform the plasma polymerization in a non-oxidizing atmosphere.

To perform the plasma polymerization in the foregoing manner can also inhibit the combination of the siloxane parts in the plasma polymerization. The combination of the organic molecule parts can be thereby dominant, as a result of which the main chain structure, where the siloxane parts and the organic parts are alternately combined, can be easily formed.

In the method for forming the organic/inorganic hybrid insulation film according to the present invention, it is preferable for the organic silicon compound to have a straight-chain siloxane structure.

The organic silicon compound having the straight-chain siloxane structure has a lower vapor pressure compared to a cyclic organic silicon compound and the like, and thereby more easily vaporized. When such a material is used, it can be prevented that the solid and liquid substances generated in the vaporizing device or piping clogs the piping, and the like. As a result, the reduction of the operation rate of the plasma CVD apparatus can be prevented.

It is also preferable for the organic silicon compound to have a cyclic siloxane structure.

According to such a structure, a polymeric three-dimensional network can be formed without fail, which enables the formation of the organic/inorganic hybrid insulation film having a higher mechanical strength (for example, a higher degree of elasticity).

In the method for forming the organic/inorganic hybrid insulation film according to the present invention, it is preferable that the organic silicon compound contains a plurality of organic groups and the plurality of organic groups are any of organic groups including alkyl group, vinyl group, derivative of the vinyl group, phenyl group, and derivative of phenyl group (a part or all of the organic groups may be an identical organic group or different organic groups).

Such an organic silicon compound can be utilized as the inexpensive material for realizing the effect of the organic/inorganic hybrid insulation film according to the present invention.

It is preferable that the organic silicon compound contains a plurality of siloxane-bonded silicon atoms and the plurality of organic groups are respectively combined with the plurality of silicon atoms.

When such a material is used, the polymer having the main chain structure, where the siloxane parts and the organic parts are alternately combined, can be surely polymerized.

Further, it is preferable for the plurality of organic groups to be any of the organic groups including methyl group, ethyl group, propyl group, butyl group (including cyclobutyl group), pentyl group (including cyclopentyl group), hexyl group (including cyclohexyl group), vinyl group, derivative of the vinyl group, phenyl group, and derivative of the phenyl group (a part or all of the organic groups may be an identical organic group or different organic groups).

When the foregoing organic silicon compound is used as the material, the effect of the organic/inorganic hybrid insulation film according to the present invention can be surely realized.

Further, it is preferable for two of the plurality of organic groups to be any of organic groups including ethyl group, propyl group, butyl group (including cyclobutyl group), pentyl group (including cyclopentyl group), hexyl group (including cyclohexyl group), vinyl group, derivative of the vinyl group, phenyl group, and derivative of the phenyl group. The two organic groups may be an identical organic group or different organic groups.

In the foregoing manner, the organic silicon compound has two radicalizable organic groups, which is advantageous for a radical polymerization. When such a organic silicon compound is used as the material, the method for forming the organic/inorganic hybrid insulation film according to the present invention can be certainly realized.

Further, it is more preferable for at least three of the plurality of organic groups to be any of the organic groups including ethyl group, propyl group, butyl group (including cyclobutyl group), pentyl group (including cyclopentyl group), hexyl group (including cyclohexyl group), vinyl group, derivative of the vinyl group, phenyl group, and derivative of the phenyl group. A part or all of the at least three organic groups may be an identical organic group or different organic groups.

In the foregoing manner, the organic silicon compound has at least three radicalizable organic groups, and the polymer having a branch structure can be easily synthesized as a result of the radical polymerization. Then, the polymeric three-dimensional network can be thereby formed, which enables the formation of the organic/inorganic hybrid insulation film having a higher mechanical strength (for example, a higher degree of elasticity).

Further, it is more preferable that at least two of the plurality of organic groups are any of the organic groups including ethyl group, propyl group, butyl group (including cyclobutyl group), pentyl group (including cyclopentyl group), hexyl group (including cyclohexyl group), vinyl group, derivative of the vinyl group, phenyl group, and derivative of the phenyl group and at least two of the organic groups are combined with at least two different silicon atoms of the plurality of silicon atoms.

In the foregoing manner, the polymer having the main chain structure, where the siloxane parts and the organic parts are alternately combined, can be unfailingly realized. Thereby, the organic/inorganic hybrid insulation film having a structure, where the siloxane parts are not adjacent but separated by the organic molecule parts, can be formed.

Further, in the method for forming the organic/inorganic hybrid insulation film according to the present invention, it is preferable for the organic silicon compound, as the organic silicon compound having the straight-chain siloxane structure, to be any of 1,3-diphenyl-1,1,3,3-tetramethyldisiloxane, 1,3-dimethyl-1,1,3,3-tetraphenyldisiloxane, 1,3-divinyl-1,1,3,3-tetramethyldisiloxane, 1,3-dimethyl-1,1,3,3-tetravinyldisiloxane, hexaphenyldisiloxane, and hexavinyldisiloxane.

To use such a siloxane derivative as the material enables the formation of the organic/inorganic hybrid insulation film made of the polymer having the structure where the siloxane bonds are not adjacent but separated by the organic components, certainly achieving the effect of the present invention.

Further, in the method for forming the organic/inorganic hybrid insulation film according to the present invention, it is preferable for the organic silicon compound, as the organic silicon compound having the cyclic siloxane structure, to be any of 1,3-diphenyl-1,3,5,5-tetramethylcyclotrisiloxane, 1,3,5-triphenyl-1,3,5-trimethylcyclotrisiloxane, 1,3-divinyl-1,3,5,5-tetramethylcyclotrisiloxane, 1,3,5-trivinyl-1,3,5-trimethylcyclotrisiloxane, 1,3-diphenyl-1,3,5,5,7,7-hexamethylcyclotetrasiloxane, 1,5-diphenyl-1,3,3,5,7,7-hexamethylcyclotetrasiloxane, 1,3,5-triphenyl-1,3,5,7,7-tetramethylcyclotetrasiloxane, 1,3,-divinyl-1,3,5,5,7,7-hexamethylcyclotetrasiloxane, 1,5-divinyl-1,3,3,5,7,7-hexamethylcyclotetrasiloxane, and 1,3,5-trivinyl-1,3,5,7,7-tetramethylcyclotetrasiloxane.

By using the foregoing cyclic siloxane derivative as the material, the organic/inorganic hybrid insulation film having the structure where the siloxane bonds are not adjacent but separated by the organic components and further having with a higher certainty the polymeric three-dimensional network can be formed. The organic/inorganic hybrid insulation film according to the present invention having a higher mechanical strength can be thereby certainly formed.

As described, according to the present invention, the method for inexpensively forming the organic/inorganic hybrid insulation film having a higher Cu diffusion preventing function and lower dielectric constant (for example, dielectric constant is approximately 2.5) without decreasing the operation rate of the apparatus can be provided. Further can be provided the method for forming the organic/inorganic hybrid insulation film having a higher mechanical strength because of the formation of the three-dimensional network of the organic polymer therein. Therefore, the method for forming the organic/inorganic hybrid insulation film according to the present invention is very effective, for example, as a method for forming an inter-layer insulation film in VLSI where a Cu wiring technology is adopted, or the like.

DETAILED DESCRIPTION OF THE INVENTION

Hereinafter, a method for forming an organic/inorganic hybrid insulation film according to an embodiment of the present invention is described referring to the accompanying drawings.

Figure 1:
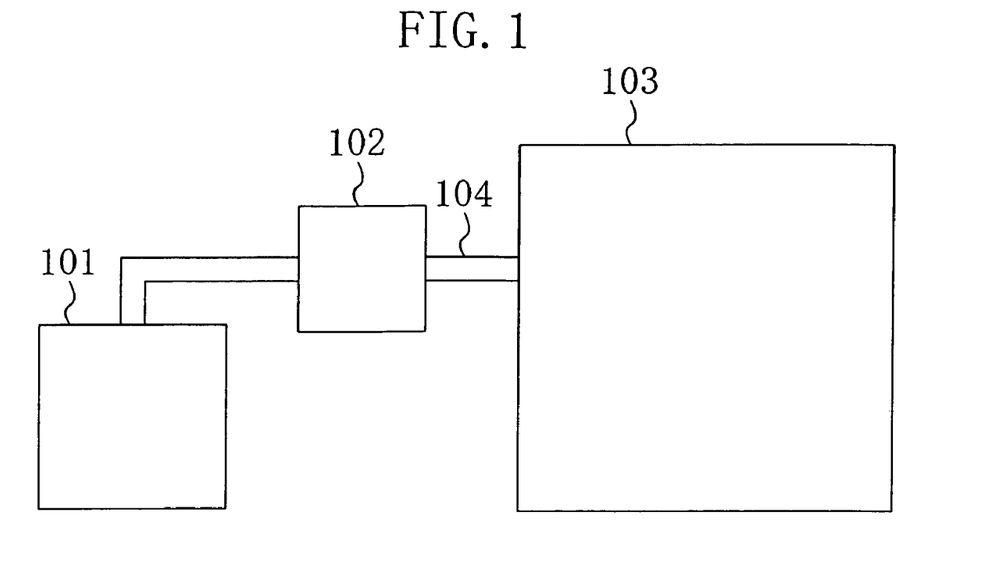
FIG. 1 is a schematic configuration of a plasma CVD apparatus used in a method for forming an organic/inorganic hybrid insulation film according to an embodiment of the present invention.
Figure 2:
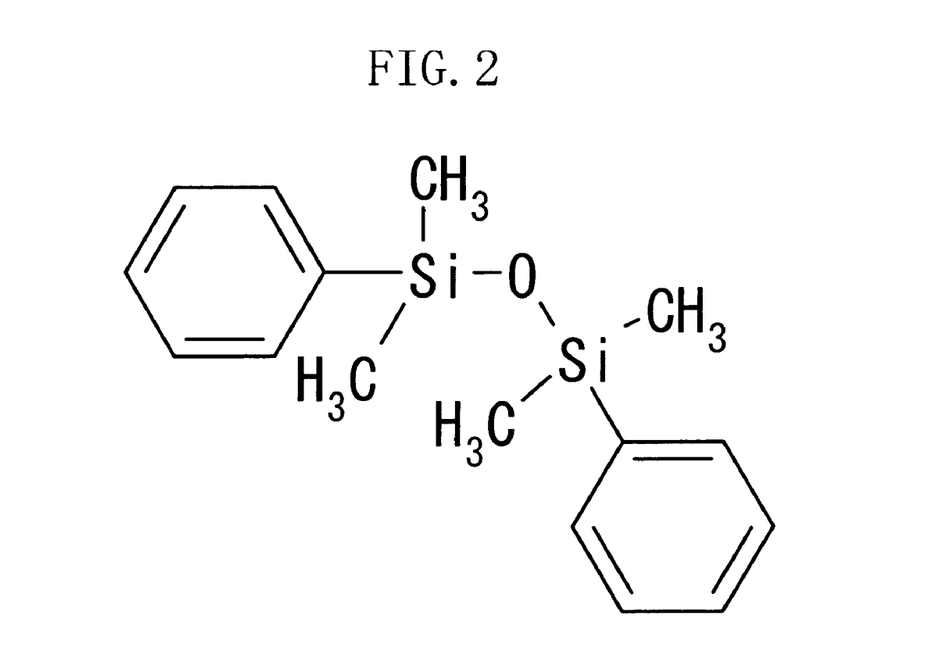
FIG. 2 is a chemical formula of 1,3-diphenyl-1,1,3,3-tetramethyldisiloxane used as a CVD material in the method for forming the organic/inorganic hybrid insulation film according to the embodiment of the present invention.

In the method for forming the organic/inorganic hybrid insulation film according to the present embodiment is used a general plasma CVD apparatus of a parallel flat plate and cathode coupling type, a schematic structure of which is shown in FIG. 1. As an organic silicon compound, which is a CVD material in the present embodiment, 1,3-diphenyl-1,1,3,3-tetramethyldisiloxane is used. FIG. 2 shows a chemical formula of 1,3-diphenyl-1,1,3,3-tetramethyldisiloxane. As shown in FIG. 2, in 1,3-diphenyl-1,1,3,3-tetramethyldisiloxane, two methyl groups and a phenyl group, as organic groups, are respectively combined with silicons in the disiloxane. The phenyl group is an organic group where a polymerization is intended.

According to the present embodiment, first, 1,3-diphenyl-1,1,3,3-tetramethyldisiloxane filling up a pressurizing vessel 101 of the plasma CVD apparatus shown in FIG. 1 is compression-transported to a vaporizing device 102 using He and vaporized in the vaporizing device 102 at 180° C. The vaporized 1,3-diphenyl-1,1,3,3-tetramethyldisiloxane is introduced into a reaction chamber 103 where a substrate (not shown) is installed. Thereafter, the organic/inorganic hybrid insulation film is formed on the substrate provided in the reaction chamber 103.

1,3-diphenyl-1,1,3,3-tetramethyldisiloxane is not easily thermally polymerized even when heated at 180° C. to be thereby vaporized, and can be accordingly introduced into the reaction chamber 103 in a monomer state. For example, it is less than 1% of all of monomers which generate a thermal polymerization reaction when heated at 180° C. for a minute. Thus, there is no generation of polymeric solid or liquid substances in the vaporizing device 102 and a piping 104 for introducing vaporized material. As a result, an operation rate of the apparatus can be prevented from decreasing, which may be caused by a clogging or the like.

According to the present embodiment, a plasma polymerization was performed under the conditions that a pressure in the reaction chamber was 400 Pa, a temperature of the substrate was 400° C., a introduced flow rate of the vaporized 1,3-diphenyl-1,1,3,3-tetramethyldisiloxane was 0.1 g/min, and an RF (Radio Frequency) electric power was 0.2 W/cm$^2$. In the plasma polymerization, the phenyl groups, for example, in 1,3-diphenyl-1,1,3,3-tetramethyldisiloxane used as the organic silicon compound are radicalized by the plasma. Then, the radicalized phenyl groups are mutually combined to thereby advance the polymerization, and the organic/inorganic hybrid insulation film having, for example, a structure recited in Japanese Unexamined Patent Publication No. 2002-334872 is formed on the substrate.

The organic/inorganic hybrid insulation film thus formed has a main chain structure where siloxane parts and organic molecule parts are alternately combined. In brief, the film has the structure where the siloxane bonds are diffused in a network of the organic polymer. Such a structure can remarkably inhibit the diffusion of the Cu ions.

The above-mentioned structure is described with reference to FIGS. 3A and 3B.

Figure 3A:
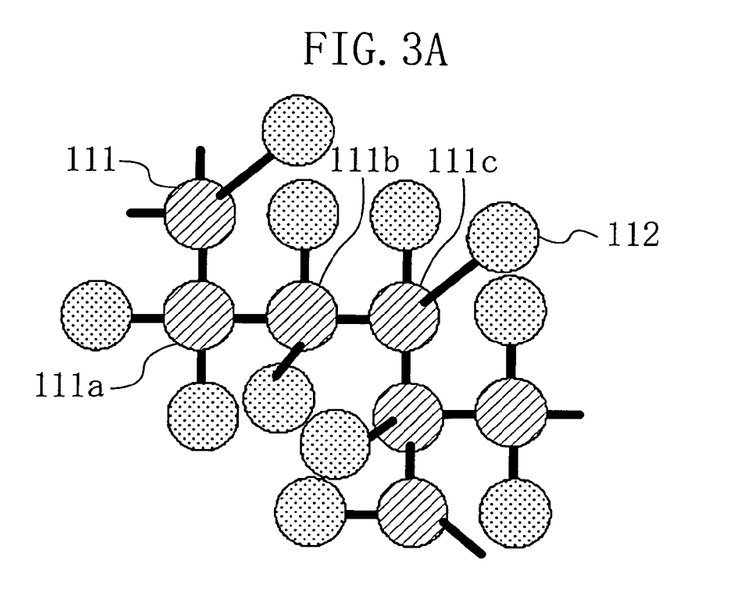
FIG. 3A is a pattern diagram of a main chain structure where siloxane parts are mutually combined.

FIG. 3A is a pattern diagram of a structure of a conventional organic/inorganic hybrid insulation film having a main chain structure where the siloxane parts are mutually combined. FIG. 3B is shows a structure of the organic/inorganic hybrid insulation film capable of efficiently preventing the Cu ions from diffusing which is obtained according to the present embodiment, wherein, to be more specific, a pattern of the structure of the organic/inorganic hybrid insulation film having the main chain structure, where the siloxane parts and the organic molecule parts are alternately combined, is illustrated. In FIGS. 3A and 3B, referring to reference numerals, 111 denotes a siloxane part, 112 denotes an organic molecule part which is not part of the main chain, and 113 denotes an organic molecule part constituting the main chain.

In FIG. 3A, the siloxane parts 111 are mutually combined to thereby constitute the main chain, wherein the Cu ion easily diffuses along the main chain made of siloxane. For example, the Cu ion is quite movable from a siloxane part 111$a$ to a siloxane part 111$b$ and further to a siloxane part 111$c$ because of a very low potential energy required for the Cu ion to move from a neighborhood of an oxygen atom to a neighborhood of a silicon atom in the siloxane bond.

Figure 3B:
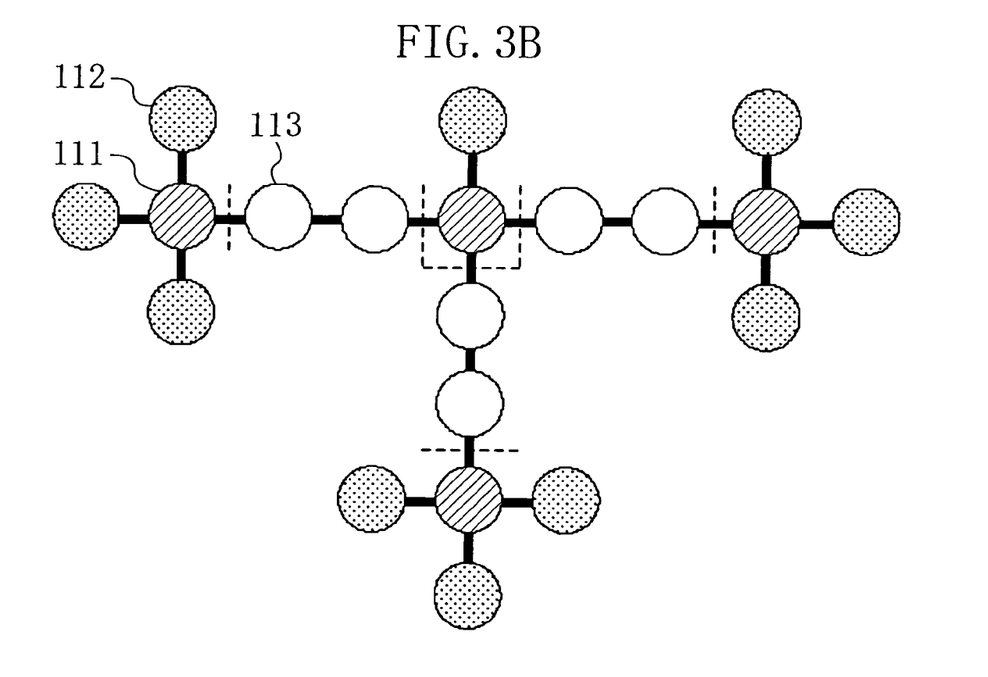
FIG. 3B is an illustration of a pattern of a main chain structure, where siloxane parts and organic molecule parts are alternately combined, of an inter-layer insulation film obtained in the method for forming the organic/inorganic hybrid insulation film according to the embodiment of the present invention.

In contrast, in the structure shown in FIG. 3B, the diffusion of the Cu ion is inhibited in a section where the siloxane part 111 and the organic molecule part 113 constituting the main chain are combined, which makes it difficult for the Cu ion to diffuse along the main chain. More specifically, it is difficult for the Cu ion to pass the part where the siloxane part 111 and the organic molecule part 113 constituting the main chain are combined, as shown in a broken line in FIG. 3B. As a result, the Cu ion is easily trapped in the siloxane part because of a significantly large potential energy required for the Cu ion to move from the neighborhood of the oxygen atom in the siloxane part 111 to the neighborhood of the carbon atom in the organic molecule part 113 constituting the main chain.

Because the structure shown in FIG. 3B is realizable according to the method for forming the organic/inorganic hybrid insulation film of the present embodiment, the organic/inorganic hybrid insulation film capable of inhibiting the diffusion of the Cu ions along the main chain can be formed. Therefore, the organic/inorganic hybrid insulation film having a higher capability of preventing the Cu ions from diffusing can be realized.

Additionally, the plasma polymerization without the intervention of any oxidizing agent, such as $O_2$ or $N_2O$, can prevent the siloxane parts from combining with one another. As a result, the structure shown in FIG. 3B can be surely realized, and the organic/inorganic hybrid insulation film capable of efficiently preventing the Cu ions from diffusing can be thereby realized.

According to the present embodiment, as a result of using 1,3-diphenyl-1,1,3,3-tetramethyldisiloxane as the material to thereby form the organic/inorganic hybrid insulation film by means of the plasma CVD method, the organic/inorganic hybrid insulation film is formed at the film formation speed of 120 nm/min, while obtaining the dielectric constant of 2.5. The dielectric constant in an inter-layer insulation film using divinylsiloxane bisbenzocyclobutene in a conventional technology for forming the Cu diffusion preventing film is 2.7. Thus, the dielectric constant of the inorganic/inorganic hybrid insulation film according to the present embodiment results in a lower value compared to the conventional technology.

A drift velocity due to an electric field of the Cu ions in the inorganic/inorganic hybrid insulation film according to the present embodiment was measured and obtained as $1.2 \times 10^5$ ions/(cm$^2$·s) under the conditions of the applied electric field of 0.8 MV/cm and the temperature of 150° C. The value is approximately ⅕ compared to the inter-layer insulation film using divinylsiloxane bisbenzocyclobutene, which proves that the organic/inorganic hybrid insulation film according to the present embodiment has the Cu diffusion preventing capability superior to that of the conventional technology. It is believed that the capability is obtained because the Cu ions are efficiently trapped in the siloxane bonds diffused in the network of the organic polymer.

A degree of elasticity of the organic/inorganic hybrid insulation film formed according to the present embodiment was measured by means of a nanoindenter and obtained as approximately 9 GPa, which was twice as strong as that of the conventional organic film having the low dielectric constant.

Thus, according to the present embodiment, the organic/inorganic hybrid insulation film superior also in mechanical strength to the conventional technology can be achieved.

Further, 1,3-diphenyl-1,1,3,3-tetramethyldisiloxane, used as the material in the present embodiment is less expensive than divinylsiloxane bisbenzocyclobutene used in the conventional technology. The organic/inorganic hybrid insulation film according to the present embodiment can be thereby formed at a lower cost compared to the inter-layer insulation film according to the conventional technology.

As described, according to the present embodiment, the organic/inorganic hybrid insulation film having the lower dielectric constant of approximately 2.5 and provided with a high Cu diffusion preventing function and mechanical strength can be inexpensively achieved compared to the conventional technology without lowering the operation rate of the apparatus.

Figure 4:
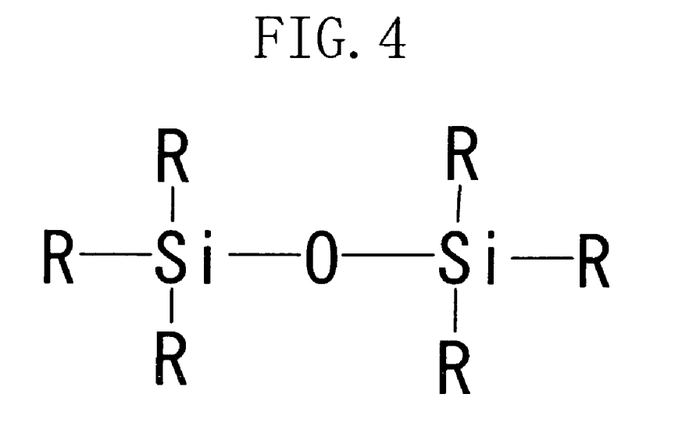
FIG. 4 is a chemical formula of a disiloxane derivative usable in the method for forming the organic/inorganic hybrid insulation film according to the embodiment of the present invention.

In the present embodiment, a disiloxane derivative, in which the silicon in the disiloxane is combined with two phenyl groups and four methyl groups as the organic groups, is used as the organic silicon compound, which is the CVD material. However, a disiloxane derivative of a chemical formula shown in FIG. 4 may replace the above-mentioned disiloxane derivative as the CVD material. In FIG. 4, R denotes any of organic groups including methyl group, ethyl group, propyl group, butyl group (including cyclobutyl group), pentyl group (including cyclopentyl group), hexyl group (including cyclohexyl group), vinyl group, derivative of the vinyl group, phenyl group, and derivative of the phenyl group, providing that all of the Rs cannot be the methyl group.

The foregoing CVD material may be used to thereby form the organic/inorganic hybrid insulation film having the main chain structure where the siloxane parts and the organic molecule parts are alternately combined, wherein the effect according to the present embodiment can be achieved.

Further, according to the present embodiment, it is preferable to use such an organic silicon compound shown in the chemical formula of FIG. 4, as the CVD material, that at least two groups of the Rs are any of the organic groups other than the methyl group, (a part or all of them may be an identical group, or all of them may be different groups). This is described below.

Of the organic groups, any organic group other than the methyl group is more radicalizable than the methyl group, and therefore advantageous for the formation of the film through a plasma-excited radical polymerization. Then, the organic/inorganic hybrid insulation film according to the present embodiment can be formed without fail when at least two of the Rs are any of the organic groups other than the methyl group in the organic silicon compound shown in the chemical formula of FIG. 4. In brief, the formation of the film structure, where the siloxane bonds are diffused in the network of the organic polymer, can be ensured.

In particular, the vinyl group, derivative of the vinyl group, phenyl group, and derivative of the phenyl group contain a $\pi$ bond adequate for transfer of an electron, and are therefore more advantageous for the plasma-excited radical polymerization. Accordingly, when any of the vinyl group, derivative of the vinyl group, phenyl group, and derivative of the phenyl group, which are advantageous for the plasma-excited radical polymerization, is used for at least two of the Rs, the organic/inorganic hybrid insulation film can be formed with more certainty.

Further, in the case where the R is the alkyl group, a cleavage is likely to occur in the bond between the silicon and organic group because the radical of the alkyl group tends to be instable. When the R is the alkyl group, therefore, a yield in the radical polymerization of the organic silicon compound shown in the chemical formula of FIG. 4 tends to be reduced.

Despite the tendency that the yield is reduced, when the R is any of the organic groups including ethyl group, propyl group, butyl group (including cyclobutyl group), pentyl group (including cyclopentyl group), and hexyl group (including cyclohexyl group), that is, any of the alkyl groups in the organic groups other than the methyl group, the organic/inorganic hybrid insulation film according to the present embodiment can be substantially formed.

When the R is any of vinyl group, derivative of the vinyl group, phenyl group, and derivative of the phenyl group as an organic group having a carbon-carbon double bond, the organic/inorganic hybrid insulation film according to the present embodiment can be easily formed.

However, the methyl group is most likely to undergo the cleavage in the bond with the silicon. Therefore, when the R is the methyl group, it is difficult to polymerize the organic siloxane compound with the methyl group as a polymerizing position and thereby form the film structure where the siloxane bonds are diffused in the network of the organic polymer.

From the description so far, when at least two of the Rs are any of the before-mentioned organic groups other than the methyl group in the chemical formula shown in FIG. 4, the effect of the present invention can be substantially realized.

Further, according to the present embodiment, it is more preferable to use, as the CVD material, the disiloxane derivative in which at least three of the organic groups combined with the silicon atoms are any of the organic groups other than the methyl group. In other words, it is preferable for at least three of the Rs to be any of the before-mentioned organic groups other than the methyl group in FIG. 4. When such a CVD material is used, the polymer subjected to the polymerization definitely has a branch structure, which enables the three-dimensional network of the organic polymer to be formed. Thus, the organic/inorganic hybrid insulation film having a high mechanical strength, which is represented by the degree of elasticity or the like, can be formed.

Figure 5:
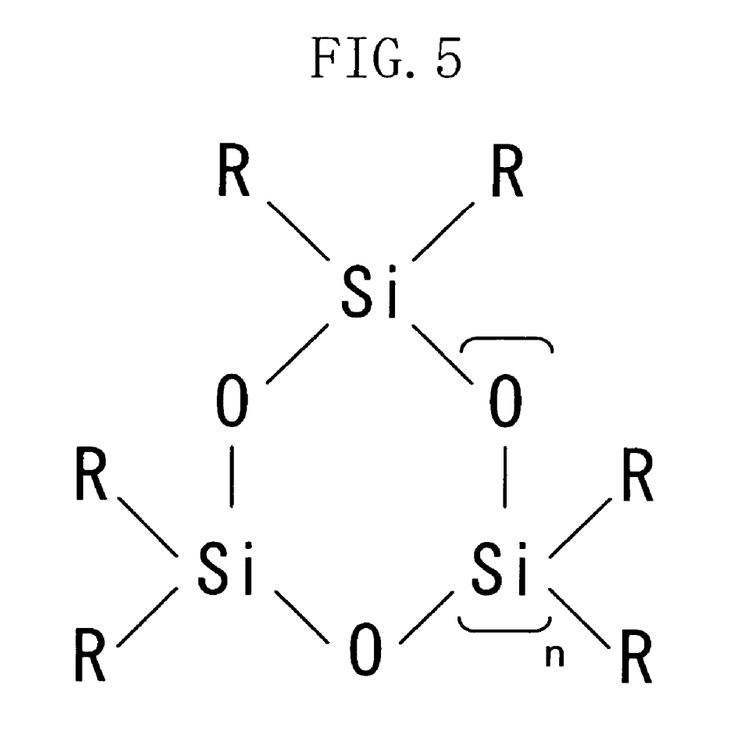
FIG. 5 is a chemical formula of a cyclic siloxane derivative usable in the method for forming the organic/inorganic hybrid insulation film according to the embodiment of the present invention.

Further, according to the present embodiment, it is possible to use, as the CVD material, a cyclic siloxane derivative, in which any of the before-mentioned organic groups is bonded with the silicon atom, in place of the organic disiloxane derivative. However, all of the organic groups bonded with the silicon atoms cannot be the methyl group. FIG. 5 shows a chemical formula of such a cyclic siloxane compound.

In FIG. 5, R denotes any of the before-mentioned organic groups though all of the Rs cannot be the methyl group. n denotes an integer $\geqq 1$, which means that the cyclic siloxane compound shown in FIG. 5 has at least three siloxane bonds. The siloxane derivative containing side chains having the siloxane structure may be alternatively used in place of the cyclic siloxane structure.

When the foregoing cyclic siloxane compound is used as the CVD material, the three-dimensional network of the organic polymer can be more easily formed. As a result, the organic/inorganic hybrid insulation film having a high mechanical strength can be formed.

In the present embodiment, as specific examples of the cyclic siloxane compound, the CVD material can employ 1,3-diphenyl-1,3,5,5-tetramethylcyclotrisiloxane, 1,3,5-triphenyl-1,3,5-trimethylcyclotrisiloxane, 1,3-divinyl-1,3,5,5-tetramethylcyclotrisiloxane, 1,3,5-trivinyl-1,3,5-trimethylcyclotrisiloxane, 1,3-diphenyl-1,3,5,5,7,7-hexamethylcyclotetrasiloxane, 1,5-diphenyl-1,3,3,5,7,7-hexamethylcyclotetrasiloxane, 1,3,5-triphenyl-1,3,5,7,7-tetramethylcyclotetrasiloxane, 1,3,-divinyl-1,3,5,5,7,7-hexamethylcyclotetrasiloxane, 1,5-divinyl-1,3,3,5,7,7- hexamethylcyclotetrasiloxane, 1,3,5-trivinyl-1,3,5,7,7-tetramethylcyclotetrasiloxane, or the like.

Figure 6:
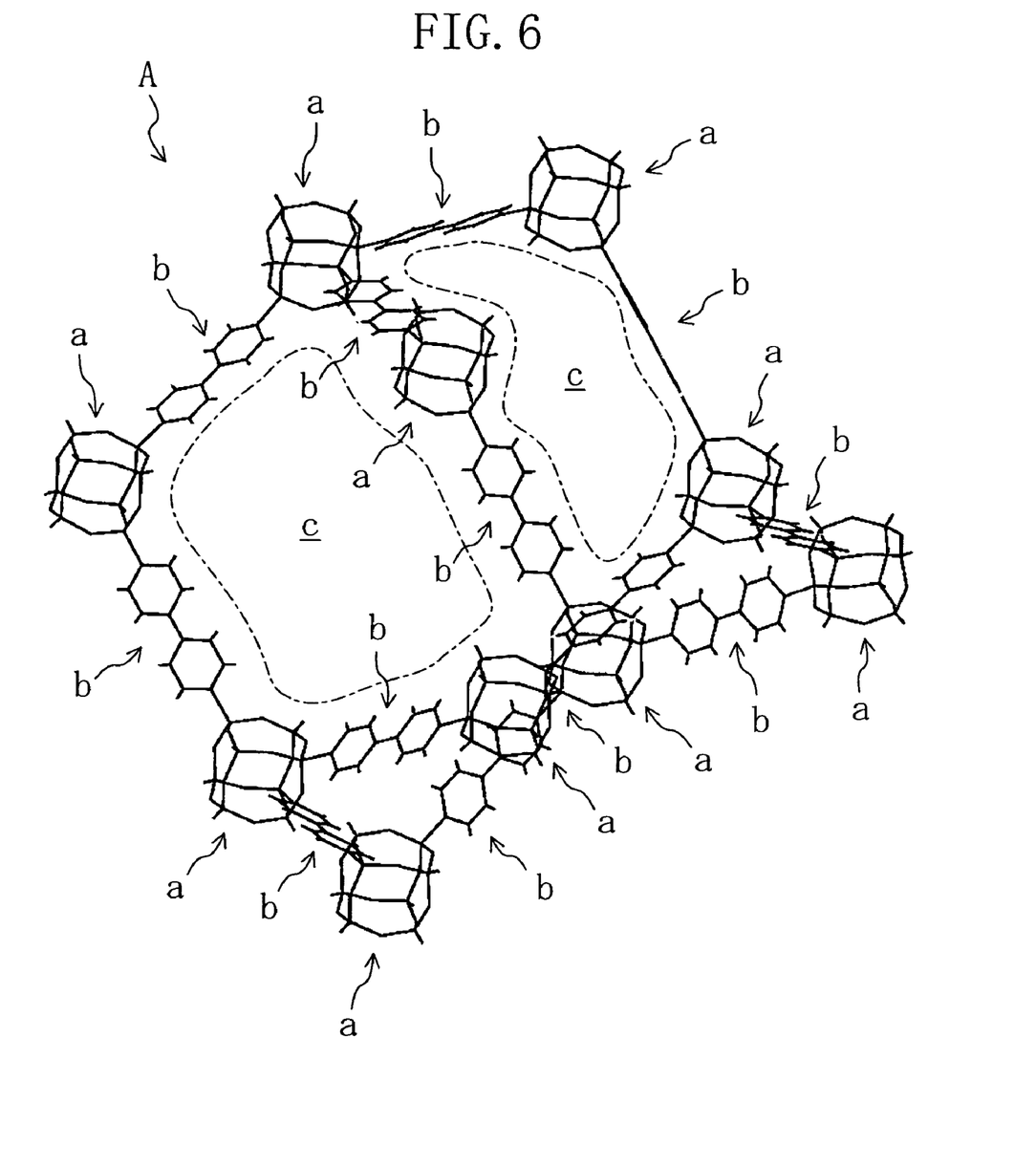
FIG. 6 is an example of a three-dimensional network structure of an organic polymer formed when the cyclic siloxane derivative is used as the CVD material in the method for forming the organic/inorganic hybrid insulation film according to the embodiment of the present invention.

FIG. 6 shows an example of a three-dimensional network structure A of the organic/inorganic hybrid polymer. In FIG. 6, reference symbols a, b and c respectively denote a siloxane part, an organic molecule part, and a void.

Further, according to the present embodiment, it is preferable to use, as the CVD material, the siloxane derivative in which at least two of the organic groups combined with the silicon atoms are any of the before-mentioned organic groups other than the methyl group (a part or all of them may be an identical group, or all of them may be different groups), and the at least two of the organic groups are combined with at least two different silicon atoms. To put it differently, it is preferable to use, as the CVD material, the organic silicon compound in which at least two of the Rs combined with the different silicon atoms are any of the before-mentioned organic groups other than the methyl group (a part or all of them may be an identical group, or all of them may be different groups) in the chemical formula of FIG. 4 or FIG. 5.

In the foregoing manner, it can be ensured that the organic/inorganic hybrid insulation film made of the polymer having the main chain structure where the siloxane parts are not adjacent but the siloxane parts and the organic molecule parts are alternately combined is formed. In 1,3-diphenyl-1,1,3,3-tetramethyldisiloxane used in the present embodiment, two phenyl groups are respectively combined with the different silicon atoms.

According to the present embodiment, as a different example of the disiloxane derivative, any of 1,3-dimethyl-1,1,3,3-tetraphenyldisiloxane, 1,3-divinyl-1,1,3,3-tetramethyldisiloxane, 1,3-dimethyl-1,1,3,3-tetravinyldisiloxane, hexaphenyldisiloxane, and hexavinyldisiloxane can be used as the CVD material.

The same effect as in the present embodiment can be surely realized by using such a disiloxane derivative.

In the present embodiment, the disiloxane derivative having two siloxane bonds, as shown in the chemical formula of FIG. 4, is used as the CVD material, however the siloxane derivative having at least three siloxane bonds may be used, an example of which is a trisiloxane derivative. The present embodiment is not limited to the straight-chain siloxane derivative, allowing the siloxane derivative having a branched siloxane framework to be used as well.

In the chemical formulas shown in FIGS. 4 and 5, the R denotes methyl group, ethyl group, propyl group, butyl group (including cyclobutyl group), pentyl group (including cyclopentyl group), hexyl group (including cyclohexyl group), the vinyl group, derivative of the vinyl group, phenyl group, or derivative of the phenyl group. In such a manner, the effect of the present invention can be certainly realized, however, it is not intended such a case, where the R denotes any organic group other than the mentioned, for example, heptyl group, is excluded.

What is claimed is:

1. A method for forming an organic/inorganic hybrid insulation film comprising:
    a step for vaporizing an organic silicon compound containing siloxane bonds;
    a step for transporting the vaporized organic silicon compound to a reaction chamber while maintaining the compound in a monomer state; and
    a step for forming the organic/inorganic hybrid insulation film having a main chain structure where siloxane parts and organic molecule parts are alternately combined on a substrate installed in the reaction chamber by plasma-polymerizing the vaporized organic silicon compound in the reaction chamber,
    wherein the organic silicon compound contains a plurality of silicon atoms which are siloxane-bonded, and a plurality of organic groups respectively combined with the plurality of silicon atoms,
    at least two of the plurality of organic groups are any of organic groups other than methyl group, and
    the plasma polymerization is performed without using an oxidizing agent to inhibit combination of the siloxane parts.

2. The method for forming the organic/inorganic hybrid insulation film as claimed in claim 1, wherein
    the organic silicon compound has a straight-chain siloxane structure.

3. The method for forming the organic/inorganic hybrid insulation film as claimed in claim 2, wherein
    the organic silicon compound is any of 1,3-diphenyl-1,1,3,3-tetramethyldisiloxane, 1,3-dimethyl-1,1,3,3-tetraphenyldisiloxane, 1,3-divinyl-1,1,3,3-tetramethyldisiloxane, 1,3-dimethyl-1,1,3,3-tetravinyldisiloxane, hexaphenyldisiloxane, and hexavinyldisiloxane.

4. The method for forming the organic/inorganic hybrid insulation film as claimed in claim 1, wherein
    at least two of the plurality of organic groups are any of organic groups including ethyl group, propyl group, butyl group (including cyclobutyl group), pentyl group (including cyclopentyl group), hexyl group (including cyclohexyl group), vinyl group, derivative of the vinyl group, phenyl group, and derivative of the phenyl group, and
    the remainder of the plurality of organic groups are any of organic groups including methyl group, ethyl group, propyl group, butyl group (including cyclobutyl group), pentyl group (including cyclopentyl group), hexyl group (including cyclohexyl group), vinyl group, derivative of the vinyl group, phenyl group, and derivative of the phenyl group.

5. The method for forming the organic/inorganic hybrid insulation film as claimed in claim 1, wherein
    at least three of the plurality of organic groups are any of organic groups including ethyl group, propyl group, butyl group (including cyclobutyl group), pentyl group (including cyclopentyl group), hexyl group (including cyclohexyl group), vinyl group, derivative of the vinyl group, phenyl group, and derivative of the phenyl group.

6. The method for forming the organic/inorganic hybrid insulation film as claimed in claim 1, wherein
    at least two of the plurality of organic groups are any of organic groups including ethyl group, propyl group, butyl group (including cyclobutyl group), pentyl group (including cyclopentyl group), hexyl group (including cyclohexyl group), vinyl group, derivative of the vinyl group, phenyl group, and derivative of the phenyl group, and
    the at least two of the organic groups are combined with at least two different silicon atoms of the plurality of silicon atoms.

7. The method for forming the organic/inorganic hybrid insulation film as claimed in claim 1, wherein
    the organic silicon compound has a cyclic siloxane structure.

8. The method for forming the organic/inorganic hybrid insulation film as claimed in claim 7, wherein
    the organic silicon compound is any of 1,3-diphenyl-1,3,5,5-tetramethylcyclotrisiloxane, 1,3,5-triphenyl-1,3,5- trimethylcyclotrisiloxane, 1,3-divinyl-1,3,5,5-tetramethylcyclotrisiloxane, 1,3,5-trivinyl-1,3,5-trimethylcyclotrisiloxane, 1,3-diphenyl-1,3,5,5,7,7-hexamethylcyclotetrasiloxane, 1,5-diphenyl-1,3,3,5,7,7-hexamethylcyclotetrasiloxane, 1,3,5-triphenyl-1,3,5,7,7-tetramethylcyclotetrasiloxane, 1,3,-divinyl-1,3,5,5,7,7-hexamethylcyclotetrasiloxane, 1,5-divinyl-1,3,3,5,7,7-hexamethylcyclotetrasiloxane, and 1,3,5-trivinyl-1,3,5,7,7-tetramethylcyclotetrasiloxane.

9. The method for forming the organic/inorganic hybrid insulation film as claimed in claim 1, wherein at least two of the plurality of organic groups are any of organic groups including ethyl group, propyl group, and butyl group (including cyclobutyl group).

10. A method for forming an organic/inorganic hybrid insulation film comprising:
   a step for vaporizing an organic silicon compound containing siloxane bonds preventing the compound from being thermally polymerized;
   a step for transporting the vaporized organic silicon compound to a reaction chamber; and
   a step for forming the organic/inorganic hybrid insulation film having a main chain structure where siloxane parts and organic molecule parts are alternately combined on a substrate installed in the reaction chamber by plasma-polymerizing the vaporized organic silicon compound in the reaction chamber,
   wherein the organic silicon compound contains a plurality of silicon atoms which are siloxane-bonded, and a plurality of organic groups respectively combined with the plurality of silicon atoms,
   at least two of the plurality of organic groups are any of organic groups other than methyl group, and
   the plasma polymerization is performed without using an oxidizing agent to inhibit combination of the siloxane parts.

11. A method for forming an organic/inorganic hybrid insulation film comprising:
   a step for vaporizing an organic silicon compound containing siloxane bonds;
   a step for transporting the vaporized organic silicon compound to a reaction chamber while maintaining the compound in a monomer state; and
   a step for forming the organic/inorganic hybrid insulation film having a main chain structure where siloxane parts and organic molecule parts are alternately combined on a substrate installed in the reaction chamber by plasma-polymerizing the vaporized organic silicon compound in the reaction chamber,
   wherein the organic silicon compound contains a plurality of silicon atoms which are siloxane-bonded, and a plurality of organic groups respectively combined with the plurality of silicon atoms,
   at least two of the plurality of organic groups are any of organic groups other than methyl group, and
   the plasma polymerization is performed in a non-oxidizing atmosphere to inhibit combination of the siloxane parts.

12. A method for forming an organic/inorganic hybrid insulation film comprising:
   a step for vaporizing an organic silicon compound containing siloxane bonds preventing the compound from being thermally polymerized;
   a step for transporting the vaporized organic silicon compound to a reaction chamber; and
   a step for forming the organic/inorganic hybrid insulation film having a main chain structure where siloxane parts and organic molecule parts are alternately combined on a substrate installed in the reaction chamber by plasma-polymerizing the vaporized organic silicon compound in the reaction chamber,
   wherein the organic silicon compound contains a plurality of silicon atoms which are siloxane-bonded, and a plurality of organic groups respectively combined with the plurality of silicon atoms,
   at least two of the plurality of organic groups are any of organic groups other than methyl group, and
   the plasma polymerization is performed in a non-oxidizing atmosphere to inhibit combination of the siloxane parts.

* * * * *